United States Patent
Oie et al.

(10) Patent No.: US 12,338,381 B2
(45) Date of Patent: Jun. 24, 2025

(54) PROTECTIVE FLUID FOR ALUMINA, PROTECTION METHOD, AND PRODUCTION METHOD FOR SEMICONDUCTOR SUBSTRATE HAVING ALUMINA LAYER USING SAME

(71) Applicant: MITSUBISHI GAS CHEMICAL COMPANY, INC., Chiyoda-ku (JP)

(72) Inventors: Toshiyuki Oie, Katsushika-ku (JP); Priangga Perdana Putra, Katsushika-ku (JP); Akinobu Horita, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 998 days.

(21) Appl. No.: 16/976,565

(22) PCT Filed: Feb. 27, 2019

(86) PCT No.: PCT/JP2019/007409
§ 371 (c)(1),
(2) Date: Aug. 28, 2020

(87) PCT Pub. No.: WO2019/167971
PCT Pub. Date: Sep. 6, 2019

(65) Prior Publication Data
US 2021/0002551 A1  Jan. 7, 2021

(30) Foreign Application Priority Data
Mar. 2, 2018  (JP) .................................. 2018-037144

(51) Int. Cl.
*C09K 15/02*  (2006.01)
*B05D 5/00*  (2006.01)
(Continued)

(52) U.S. Cl.
CPC ................ *C09K 15/02* (2013.01); *B05D 5/00* (2013.01); *C01F 7/021* (2013.01); *H01L 21/0206* (2013.01)

(58) Field of Classification Search
CPC ......... C23F 11/00; C23F 11/18; C23F 11/185; C09K 15/02; B05D 5/00; C01F 7/023;
(Continued)

(56) References Cited

U.S. PATENT DOCUMENTS 2,779,742 A * 1/1957 Emmett .................... B01J 21/00
  502/250
4,048,247 A * 9/1977 Ryu .......................... C07C 2/68
  585/467
(Continued)

FOREIGN PATENT DOCUMENTS

EP    3 220 409 A1   9/2017
JP    8-181048 A     7/1996
(Continued)

OTHER PUBLICATIONS

Machine Translation of JP 2000-284487 A, cited in IDS filed Aug. 28, 2020 (Year: 2000).*
(Continued)

*Primary Examiner* — Jennifer Wecker
*Assistant Examiner* — Brady C Pilsbury
(74) *Attorney, Agent, or Firm* — Oblon, McClelland, Maier & Neustadt, L.L.P.

(57) ABSTRACT

The present invention pertains to a protective fluid for alumina, a protection method, and a production method for semiconductor substrate having an alumina layer using same. This alumina protective fluid is characterized by: containing 0.0001%-20% by mass of an alkali earth metal compound; and the alkali earth metal being at least one selected from the group consisting of beryllium, magnesium, (Continued)

strontium, and barium. As a result of the present invention, alumina corrosion can be suppressed during the production process for semiconductor circuits.

20 Claims, 5 Drawing Sheets (51) Int. Cl.
*C01F 7/021* (2022.01)
*H01L 21/02* (2006.01)
(58) Field of Classification Search
CPC .......... H01L 21/0206; H01L 21/02172; H01L 21/02282; H01L 21/3065; H01L 21/02057; H01L 21/02178; H01L 21/0332; H01L 21/28158; H01L 21/76829; C01B 21/38; C01B 21/20; C09D 5/08; C09D 1/00; C09D 7/40
See application file for complete search history.

(56) References Cited

U.S. PATENT DOCUMENTS

| | | | | |
|---|---|---|---|---|
| 4,489,138 A * | 12/1984 | Yamatsuta | ............. | B22D 19/14 428/614 |
| 5,210,062 A * | 5/1993 | Narula | ................. | B01J 37/0219 502/341 |
| 5,756,222 A | 5/1998 | Bercaw et al. | | |
| 5,811,195 A | 9/1998 | Bercaw et al. | | |
| 5,874,057 A * | 2/1999 | Deeba | ................ | B01D 53/9422 423/239.1 |
| 5,922,295 A * | 7/1999 | Chattha | ............. | B01D 53/9422 502/313 |
| 2001/0046943 A1* | 11/2001 | Cheung | .................. | B01J 23/005 502/333 |
| 2004/0115111 A1* | 6/2004 | Twigg | .................. | F01N 3/0842 423/239.1 |
| 2005/0095189 A1* | 5/2005 | Brey | ...................... | B01D 53/44 502/340 |
| 2005/0130082 A1 | 6/2005 | Kanda et al. | | |
| 2006/0244034 A1 | 11/2006 | Sakurai et al. | | |
| 2010/0196226 A1* | 8/2010 | Watson | ..................... | B01J 23/58 502/328 |
| 2012/0165185 A1* | 6/2012 | Gramiccioni | ........ | B01J 37/0207 502/217 |
| 2012/0329216 A1* | 12/2012 | Dhar | ..................... | H01L 29/513 257/E21.409 |
| 2013/0143408 A1 | 6/2013 | Rantala et al. | | |
| 2013/0156827 A1* | 6/2013 | Li | ......................... | A61K 9/1682 514/300 |
| 2014/0088333 A1* | 3/2014 | Khare | ...................... | B01J 38/12 585/419 |
| 2015/0011045 A1* | 1/2015 | Kim | .................... | H01L 29/7869 427/58 |
| 2015/0037498 A1* | 2/2015 | Bruck | .................. | B23K 26/706 428/457 |
| 2017/0200615 A1 | 7/2017 | Rantala et al. | | |
| 2017/0233687 A1 | 8/2017 | Oie et al. | | |
| 2017/0271381 A1* | 9/2017 | Sone | ..................... | G09G 3/2092 |
| 2020/0031100 A1* | 1/2020 | Hayasaka | ............ | D06M 13/192 |

FOREIGN PATENT DOCUMENTS

| | | |
|---|---|---|
| JP | 2000-284487 A | 10/2000 |
| JP | 2001000864 A * | 1/2001 |
| JP | 2003-195517 A | 7/2003 |
| JP | 2013-534039 A | 8/2013 |
| JP | 2014-90156 A | 5/2014 |
| WO | WO 2016/076032 A1 | 5/2016 |

OTHER PUBLICATIONS

Machine Translation of JP 2014-090156 A, cited in IDS filed Aug. 28, 2020 (Year: 2014).*
International Preliminary Report on Patentability for International Application No. PCT/JP2019/;007409 (Year: 2019).*
SchorAR Chemistry, Material Data Safety Sheet for Barium Nitrate Solution 0.1M (Year: 2008).*
International Search Report issued on May 28, 2019 in PCT/JP2019/ 007409 filed on Feb. 27, 2019, 2 pages.
Bakke, T. et al., "Etch Stop Materials for Release By Vapor HF Etching," 16th MME workshop, 2005, 4 total pages.
Extended European Search Report issued Mar. 19, 2021 in European Patent Application No. 19759900.4, 7 pages.

* cited by examiner

PROTECTIVE FLUID FOR ALUMINA, PROTECTION METHOD, AND PRODUCTION METHOD FOR SEMICONDUCTOR SUBSTRATE HAVING ALUMINA LAYER USING SAME

CROSS-REFERENCE TO RELATED APPLICATIONS

The present application is the national stage of international application PCT/JP2019/007409, filed on Feb. 27, 2019, and claims the benefit of the filing date of Japanese Appl. No. 2018-037144, filed on Mar. 2, 2018.

TECHNICAL FIELD

The present invention relates to a protective fluid for suppressing alumina corrosion in a process of producing a semiconductor integrated circuit, a method for protecting alumina, and a method for producing a semiconductor substrate having an alumina layer using the same.

BACKGROUND ART

In a process of washing a semiconductor integrated circuit with a washing solution, a dry etching residue, a resist, a hard mask, etc. are removed. It is generally required that materials other than those to be removed are not corroded in this washing process.

Recently, with the miniaturization of design rules, the constitution of the gate of the transistor has been gradually changed from a combination of silicon oxide and polycrystalline silicon to a combination of a high dielectric constant material and a metal. There is a case where alumina is used as the high dielectric constant material.

Further, when forming a via by dry etching, a fluorine-based gas is selected. In this regard, there is a case where alumina is selected as an etch stop layer since alumina is highly resistant to the fluorine-based gas (Non-Patent Literature 1).

Moreover, there is a case where alumina is used as a material for a hard mask (Patent Literature 1).

Thus, there is a case where alumina is used in a semiconductor integrated circuit and a process of producing the same, but in this regard, there is a problem that when a washing solution containing a fluorine compound, an oxidant, an alkali, etc. generally used in a washing process is in contact with alumina, alumina is vigorously corroded. For this reason, it is desired to develop a method for suppressing alumina corrosion in a washing process in which such a washing solution is used.

CITATION LIST

Patent Literature

Patent Literature 1: Japanese Laid-Open Patent Publication No. 2013-534039

Non-Patent Literature

Non-Patent Literature 1: 16th MME workshop, Goeteborg, Sweden, 2005 "Etch stop materials for release by vapor HF etching"

SUMMARY OF INVENTION

Technical Problem

The problem to be solved by the present invention is to provide a protective fluid for alumina, a method for protecting alumina, and a method for producing a semiconductor substrate having an alumina layer using the same.

Solution to Problem

The present inventors diligently made researches and found that the above-described problem can be solved by the below-described invention. The present invention is as described below.

[1] A protective fluid (protective film-forming fluid) for alumina, which contains 0.0001 to 20% by mass of an alkaline earth metal compound, wherein the alkaline earth metal is at least one selected from the group consisting of beryllium, magnesium, strontium and barium.

[2] The protective fluid for alumina according to item [1], wherein the alkaline earth metal compound is at least one selected from the group consisting of:

beryllium nitrate, beryllium acetate, beryllium chloride, beryllium hydroxide, beryllium sulfite, beryllium chlorate, beryllium perchlorate, beryllium peroxide, beryllium chromate, beryllium oxide, beryllium cyanide, beryllium bromide, beryllium carbonate, beryllium metaborate, beryllium iodide, beryllium tetrafluoroborate, beryllium sulfate, beryllium sulfide, and a salt obtained by reacting beryllium hydroxide with an acid;

magnesium nitrate, magnesium acetate, magnesium chloride, magnesium hydroxide, magnesium sulfite, magnesium chlorate, magnesium perchlorate, magnesium peroxide, magnesium chromate, magnesium oxide, magnesium cyanide, magnesium bromide, magnesium carbonate, magnesium metaborate, magnesium iodide, magnesium tetrafluoroborate, magnesium sulfate, magnesium sulfide, and a salt obtained by reacting magnesium hydroxide with an acid;

strontium nitrate, strontium acetate, strontium chloride, strontium hydroxide, strontium sulfite, strontium chlorate, strontium perchlorate, strontium peroxide, strontium chromate, strontium oxide, strontium cyanide, strontium bromide, strontium carbonate, strontium metaborate, strontium iodide, strontium tetrafluoroborate, strontium sulfate, strontium sulfide, and a salt obtained by reacting strontium hydroxide with an acid; and barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate, barium sulfide, and a salt obtained by reacting barium hydroxide with an acid.

[3] The protective fluid for alumina according to item [1] or [2], wherein the alkaline earth metal is barium.

[4] The protective fluid for alumina according to any one of items [1] to [3], wherein the alkaline earth metal compound is at least one selected from the group consisting of barium nitrate, barium acetate, barium chloride and barium hydroxide.

[5] The protective fluid for alumina according to any one of items [1] to [4], which contains more than 1% by mass of the alkaline earth metal compound.

[6] The protective fluid for alumina according to any one of items [1] to [5], wherein the content of hydrogen peroxide is less than 0.002% by mass.

[7] A method for protecting alumina using the protective fluid for alumina according to any one of items [1] to [6]. The method for protecting alumina of the present invention includes treating at least a part of the surface of an alumina layer containing alumina using the protective fluid for alumina according to any one of items [1] to [6].

[8] A method for producing a substrate using the method for protecting alumina according to item [7]. The method for producing a substrate of the present invention is a method for producing a semiconductor substrate having an alumina layer, which includes protecting alumina contained in the alumina layer using the method for protecting alumina according to item [7].

According to a preferred embodiment of the present invention, by treating at least a part of the surface of the alumina layer with the protective fluid for alumina, a protective film is formed on at least a part of the surface of the alumina layer, and alumina contained in the alumina layer can be protected from corrosion caused by a liquid agent such as a washing solution, etc.

Advantageous Effect of Invention

According to a preferred embodiment of the present invention, it is possible to suppress alumina corrosion in the process of producing a semiconductor circuit, and it is possible to produce a semiconductor substrate having high precision and high quality with a high yield.

DESCRIPTION OF EMBODIMENTS

In the method for protecting alumina of the present invention, a protective fluid for alumina containing an alkaline earth metal compound is used. Hereinafter, the protective fluid for alumina, the method for protecting alumina and the method for producing a semiconductor substrate having an alumina layer using the same will be described in detail.

[Protective Fluid for Alumina]
<Alkaline Earth Metal Compound>

The alkaline earth metal compound to be used in the present invention is an inorganic substance containing at least one metal selected from the group consisting of beryllium, magnesium, strontium and barium. These have the effect of forming a protective film on at least a part of the surface of the alumina layer, and for example, alumina corrosion caused by a washing solution in a washing process after the formation of the protective film can be suppressed. Calcium that belongs to the same group does not have sufficient corrosion protection performance for alkalis, and radium is expensive and often unstable in the form of a compound, and therefore these are inappropriate for the use.

Specific examples of the alkaline earth metal compound include:

beryllium nitrate, beryllium acetate, beryllium chloride, beryllium hydroxide, beryllium sulfite, beryllium chlorate, beryllium perchlorate, beryllium peroxide, beryllium chromate, beryllium oxide, beryllium cyanide, beryllium bromide, beryllium carbonate, beryllium metaborate, beryllium iodide, beryllium tetrafluoroborate, beryllium sulfate, beryllium sulfide, and a salt obtained by reacting beryllium hydroxide with an acid;

magnesium nitrate, magnesium acetate, magnesium chloride, magnesium hydroxide, magnesium sulfite, magnesium chlorate, magnesium perchlorate, magnesium peroxide, magnesium chromate, magnesium oxide, magnesium cyanide, magnesium bromide, magnesium carbonate, magnesium metaborate, magnesium iodide, magnesium tetrafluoroborate, magnesium sulfate, magnesium sulfide, and a salt obtained by reacting magnesium hydroxide with an acid;

strontium nitrate, strontium acetate, strontium chloride, strontium hydroxide, strontium sulfite, strontium chlorate, strontium perchlorate, strontium peroxide, strontium chromate, strontium oxide, strontium cyanide, strontium bromide, strontium carbonate, strontium metaborate, strontium iodide, strontium tetrafluoroborate, strontium sulfate, strontium sulfide, and a salt obtained by reacting strontium hydroxide with an acid; and barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate, barium sulfide, and a salt obtained by reacting barium hydroxide with an acid. These materials may be used solely, or two or more of them may be used in combination.

Among them, barium compounds, i.e., barium nitrate, barium acetate, barium chloride, barium hydroxide, barium sulfite, barium chlorate, barium perchlorate, barium peroxide, barium chromate, barium oxide, barium cyanide, barium bromide, barium carbonate, barium metaborate, barium iodide, barium tetrafluoroborate, barium sulfate, barium sulfide, and a salt obtained by reacting barium hydroxide with an acid are preferred because these compounds have a high effect of suppressing alumina corrosion. Further, barium nitrate, barium acetate, barium chloride and barium hydroxide are particularly preferred because these compounds have high water solubility and can be easily obtained.

The concentration (content) of the alkaline earth metal compound in the protective fluid for alumina of the present invention is 0.0001 to 20% by mass, preferably 0.00025 to 17.5% by mass, more preferably 0.0005 to 15% by mass, particularly preferably 0.001 to 10% by mass, even more preferably more than 1% by mass, and still more preferably 1.5 to 10% by mass. When the concentration is within the above-described range, a protective film can be formed on at least a part of the surface of alumina, and damage to alumina can be effectively suppressed.

<Other Components>

In the protective fluid for alumina of the present invention, if desired, a component which is conventionally used in compositions for semiconductors may be blended within a range in which the purpose of the present invention is not impaired.

For example, as an additive, an alkali, an acid, a chelating agent, a surfactant, a defoaming agent, an oxidant, a reducing agent, a metal anticorrosive, a water-soluble organic solvent, etc. can be added.

<Water>

The remaining portion of the protective fluid for alumina of the present invention is water. The water which can be used in the present invention is not particularly limited, but it is preferably water from which metal ions, organic impurities, particles, etc. have been removed by distillation, ion exchange treatment, filtering treatment, adsorption treatment or the like. Pure water is more preferred, and ultrapure water is particularly preferred.

The concentration (content) of water in the protective fluid for alumina is preferably 70 to 100% by mass, more preferably 90 to 100% by mass, even more preferably 95 to 100% by mass, and particularly preferably 98 to 100% by mass.

<Method for Preparing Protective Fluid for Alumina>

The protective fluid for alumina of the present invention is prepared by adding water (preferably ultrapure water) to the alkaline earth metal compound and according to need, the other components and stirring the mixture until it becomes homogeneous.

Note that it is preferred that the protective fluid for alumina of the present invention substantially does not contain hydrogen peroxide, and it is more preferred that the concentration (content) of hydrogen peroxide in the protective fluid for alumina is less than 0.002% by mass.

<Method for Using Protective Fluid for Alumina>

The temperature at which the protective fluid for alumina of the present invention is used is usually 20 to 70° C., preferably 30 to 60° C., and particularly preferably 40 to 55° C. The conditions for using the protective fluid for alumina may be suitably selected depending on the semiconductor substrate to be used.

The time for use of the protective fluid for alumina of the present invention is usually 0.2 to 60 minutes. The conditions for using the protective fluid for alumina may be suitably selected depending on the semiconductor substrate to be used.

By using the protective fluid for alumina under the above-described conditions, a protective film can be suitably formed on at least a part of the surface of the alumina layer of the semiconductor substrate, and alumina contained in the alumina layer can be protected. Note that in the present invention, the thickness of the protective film is not particularly limited. According to a preferred embodiment of the present invention, by treating at least a part of the surface of the alumina layer with the protective fluid for alumina of the present invention, alumina contained in the alumina layer can be protected from corrosion caused by a liquid agent such as a washing solution, etc.

<Addition to Washing Solution>

The protective fluid for alumina to be used in the present invention can be added to a washing solution to be used in a process of washing a semiconductor substrate, and washing can be carried out while protecting alumina. In this case, an inorganic substance containing barium is preferably contained as the alkaline earth metal compound, and the semiconductor substrate can be suitably washed and alumina corrosion caused by the washing solution can be suppressed.

[Semiconductor Substrate]

The semiconductor substrate for which the present invention can be suitably used is a substrate, wherein:
   a substrate material such as silicon, amorphous silicon, polysilicon and glass;
   an dielectric material such as silicon oxide, silicon nitride, silicon carbide and derivatives thereof;
   a material such as cobalt, cobalt alloy, tungsten and titanium-tungsten;
   a compound semiconductor such as gallium-arsenic, gallium-phosphorus, indium-phosphorus, indium-gallium-arsenic and indium-aluminum-arsenic and an oxide semiconductor such as chromium oxide, in particular, a low-dielectric-constant interlayer dielectric film are used. The semiconductor substrate having any of such materials has an alumina layer containing alumina. Specifically, for example, the semiconductor substrate has the alumina layer as an etch stop layer, a hard mask or the like.

The content of alumina in the alumina layer is preferably 30% by mass or more, more preferably 50% by mass or more, even more preferably 70% by mass or more, still more preferably 90% by mass or more, and particularly preferably 100% by mass.

[Method for Protecting Alumina]

The method for protecting alumina of the present invention includes treating at least a part of the surface of the alumina layer with the protective fluid for alumina of the present invention. For example, the treatment is carried out by bringing the protective fluid for alumina of the present invention into contact with at least a part of the surface of the alumina layer.

The temperature and the time for use of the protective fluid for alumina of the present invention are as described in <Method for using protective fluid for alumina> above. The method for bringing the protective fluid for alumina of the present invention into contact with the surface of the alumina layer is not particularly limited. For example, it is possible to employ a method of bringing the protective fluid for alumina of the present invention into contact with the surface of the alumina layer by means of dropping (single wafer spin process), spray or the like, a method of immersing the surface of the alumina layer in the protective fluid for alumina of the present invention, or the like. In the present invention, either of such methods may be employed.

By using the method for protecting alumina of the present invention, alumina contained in the alumina layer can be protected from corrosion caused by a liquid agent such as a washing solution, etc., and alumina corrosion can be suppressed.

[Method for Producing Semiconductor Substrate Having Alumina Layer]

The method for producing the semiconductor substrate of the present invention includes protecting alumina contained in the alumina layer of the semiconductor substrate using the method for protecting alumina of the present invention. Accordingly, alumina contained in the alumina layer can be protected from corrosion caused by a liquid agent such as a washing solution, etc., and it is possible to produce the semiconductor substrate while suppressing alumina corrosion without affecting electrical properties.

The temperature and the time for use of the composition of the present invention are as described in <Method for using protective fluid for alumina> above. The method for bringing the composition of the present invention into contact with the surface of the alumina layer of the semiconductor substrate is as described in [Method for protecting alumina] above.

FIGS. 1 to 5 show examples of a cross-section structure of a semiconductor substrate having an alumina layer.

Figure 1:
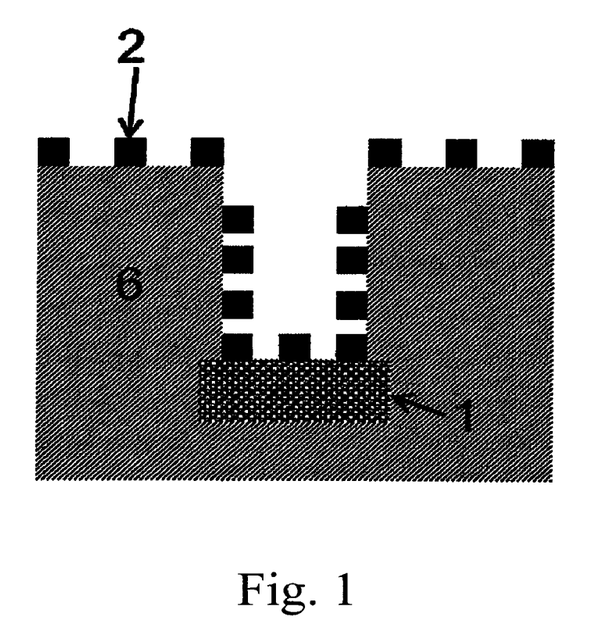
FIG. 1 is a schematic cross sectional view of a semiconductor substrate having a low-dielectric-constant interlayer dielectric film prior to removal of a dry etching residue, wherein the bottom of a via is alumina, according to one embodiment.

FIG. 1 is a schematic cross sectional view of a semiconductor substrate having a low-dielectric-constant interlayer dielectric film prior to removal of a dry etching residue, wherein the bottom of a via is alumina, according to one embodiment. In FIG. 1, a via is formed in a low-dielectric-constant interlayer dielectric film 6 by dry etching, and the bottom of the via is alumina 1. A dry etching residue 2 adheres to the surfaces of the via and the low-dielectric-constant interlayer dielectric film 6.

Figure 2:
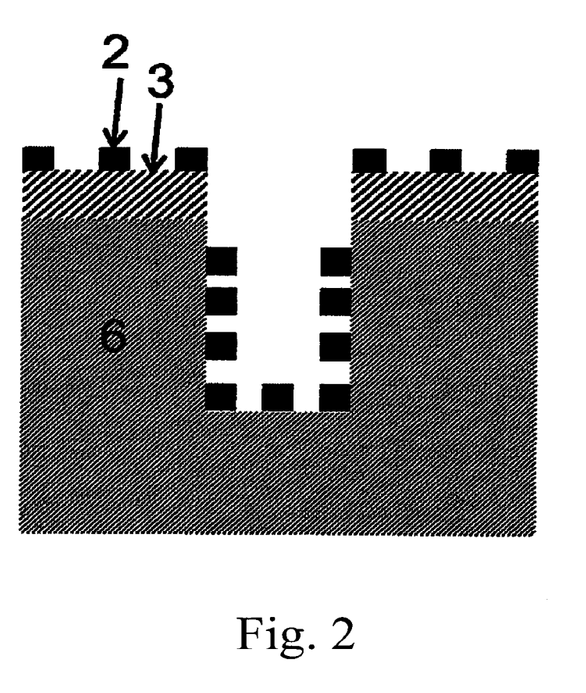
FIG. 2 is a schematic cross sectional view of a semiconductor substrate having a low-dielectric-constant interlayer dielectric film prior to removal of a dry etching residue, wherein a hard mask is alumina, according to one embodiment.

FIG. 2 is a schematic cross sectional view of a semiconductor substrate having a low-dielectric-constant interlayer dielectric film prior to removal of a dry etching residue, wherein a hard mask is alumina, according to one embodiment. In FIG. 2, an alumina-based hard mask 3 is layered on a low-dielectric-constant interlayer dielectric film 6, and a via is formed therein by dry etching. A dry etching residue 2 adheres to the surfaces of the via and the alumina-based hard mask 3.

Figure 3:
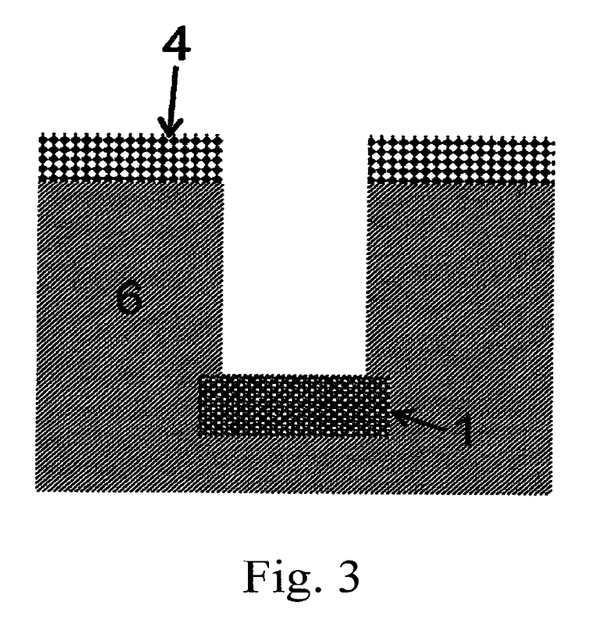
FIG. 3 is a schematic cross sectional view of a semiconductor substrate having a low-dielectric-constant interlayer dielectric film prior to removal of a hard mask (alumina-based hard mask is excluded), wherein the bottom of a via is alumina, according to one embodiment.

FIG. 3 is a schematic cross sectional view of a semiconductor substrate having a low-dielectric-constant interlayer dielectric film prior to removal of a hard mask (alumina-based hard mask is excluded), wherein the bottom of a via is alumina, according to one embodiment. In FIG. 3, a hard mask (alumina-based hard mask is excluded) 4 is layered on a low-dielectric-constant interlayer dielectric film 6, and a via is formed therein. The bottom of the via is alumina 1.

Figure 4:
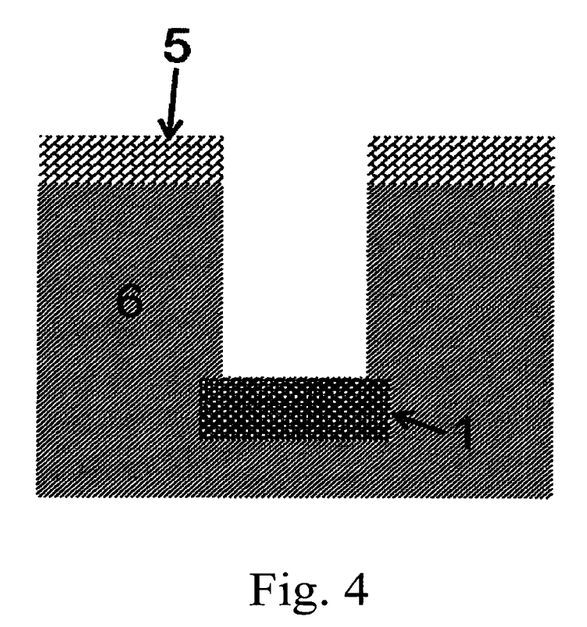
FIG. 4 is a schematic cross sectional view of a semiconductor substrate having a low-dielectric-constant interlayer dielectric film prior to removal of a resist, wherein the bottom of a via is alumina, according to one embodiment.

FIG. 4 is a schematic cross sectional view of a semiconductor substrate having a low-dielectric-constant interlayer dielectric film prior to removal of a resist, wherein the bottom of a via is alumina, according to one embodiment. In FIG. 4, a resist 5 is layered on a low-dielectric-constant interlayer dielectric film 6, and a via is formed therein. The bottom of the via is alumina 1.

Figure 5:
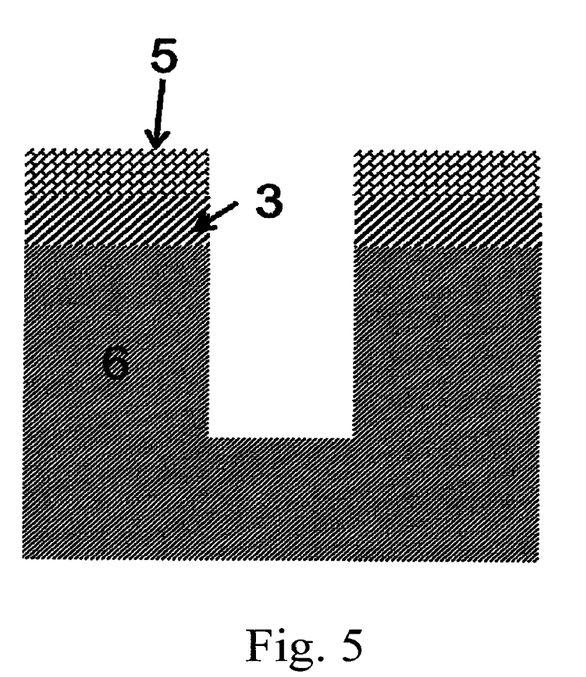
FIG. 5 is a schematic cross sectional view of a semiconductor substrate having a low-dielectric-constant interlayer dielectric film prior to removal of a resist, wherein a hard mask is alumina, according to one embodiment.

FIG. 5 is a schematic cross sectional view of a semiconductor substrate having a low-dielectric-constant interlayer dielectric film prior to removal of a resist, wherein a hard mask is alumina, according to one embodiment. In FIG. 5, an alumina-based hard mask 3 and a resist 5 are layered on a low-dielectric-constant interlayer dielectric film 6 in this order, and a via is formed therein. The bottom of the via is the low-dielectric-constant interlayer dielectric film 6.

According to the method for producing the semiconductor substrate of the present invention, in various steps in which the alumina layer of the semiconductor substrate is exposed to the surface, by protecting the surface of the alumina layer using the protective fluid for alumina of the present invention, alumina contained in the alumina layer can be protected from corrosion caused by a liquid agent such as a washing solution, etc. in the following steps, and alumina corrosion can be suppressed. According to a preferred embodiment of the present invention, it is possible to produce a semiconductor substrate having high precision and high quality with a high yield without affecting electrical properties.

EXAMPLES

Hereinafter, the present invention will be specifically described based on working examples and comparative examples, but embodiments can be suitably changed within a range in which the effects of the present invention are exerted.

Note that "%" means "% by mass" unless otherwise specified.

<Wafer with Film for Evaluation>: For Evaluation of Damage to Alumina

A chip obtained by cutting a wafer with film of 12 inches on which a film of alumina was formed (film thickness of alumina: 300 Å) into a size of 1 cm×1 cm was used.

[Evaluation Method]

<E.R. (Etching Rate)>

A wafer with an alumina film was subjected to the treatment with a protective fluid and the treatment with a washing solution at 50° C., and E.R. was calculated by dividing the difference between the film thicknesses before and after the treatments by the time for the treatment with the washing solution. The film thicknesses of the wafer with the alumina film were measured using an optical film thickness gauge n&k 1280 manufactured by n&k Technology Inc.

Examples 1-13 and Comparative Examples 1-7

In Examples 1-13 and Comparative Example 1, the wafer with the alumina film was immersed in a protective fluid shown in Table 1 at 50° C. for 1 minute and subsequently immersed in a washing solution at 50° C. for 0.5 minute, and after that, rinsing with ultrapure water and drying by dry nitrogen gas jet were carried out.

The difference between the film thicknesses of the wafer with the alumina film before and after the treatments was divided by the time for immersion in the washing solution to calculate E.R.

In Comparative Examples 2-7, the immersion treatment with a protective fluid was omitted, immersion in a washing solution at 50° C. for 0.5 minute was carried out, and after that, rinsing with ultrapure water and drying by dry nitrogen gas jet were carried out. E.R was calculated in the same manner as above.

When compared to Comparative Examples 2-7, it is understood that in Examples 1-13, alumina corrosion caused by the washing solution was successfully suppressed by the addition of the immersion treatment with the protective fluid.

It is understood that in Comparative Example 1, even when immersion in an aqueous solution containing a calcium-containing inorganic substance was carried out, alumina corrosion caused by the washing solution in the following step was not suppressed.

TABLE 1

| | Protective fluid | | Washing solution | | | | | | Al$_2$O$_3$ |
| | Alkaline earth metal (A) | Water | Fluoride | | Hydrogen peroxide | Alkali | | Water | E.R. |
| | Type | % by mass | % by mass | Type | % by mass | % by mass | Type | % by mass | % by mass | (Å/min) |
|---|---|---|---|---|---|---|---|---|---|---|
| Example 1 | Ba nitrate | 2 | 98 | NH$_4$F | 1 | | | | 99 | 32 |
| Example 2 | Ba acetate | 2 | 98 | NH$_4$F | 1 | | | | 99 | 52 |
| Example 3 | Ba chloride | 2 | 98 | NH$_4$F | 1 | | | | 99 | 48 |
| Example 4 | Ba nitrate | 2 | 98 | HF | 0.05 | | | | 99.95 | <1 |
| Example 5 | Ba nitrate | 2 | 98 | HF·KF | 1 | | | | 99 | 344 |
| Example 6 | Ba nitrate | 2 | 98 | | | 1 | KOH | 0.1 | 98.9 | 16 |
| Example 7 | Ba nitrate | 2 | 98 | | | 1 | NH$_3$ | 0.1 | 98.9 | 16 |
| Example 8 | Ba nitrate | 2 | 98 | | | 1 | TMAH | 0.1 | 98.9 | 34 |
| Example 9 | Ba nitrate | 0.001 | 99.999 | NH$_4$F | 1 | | | | 99 | 100 |
| Example 10 | Ba nitrate | 10 | 90 | NH$_4$F | 1 | | | | 99 | 36 |
| Example 11 | Be sulfate | 2 | 98 | NH$_4$F | 1 | | | | 99 | 110 |
| Example 12 | Mg nitrate | 2 | 98 | NH$_4$F | 1 | | | | 99 | 90 |
| Example 13 | Sr nitrate | 2 | 98 | NH$_4$F | 1 | | | | 99 | 110 |
| Comparative Example 1 | Ca nitrate | 2 | 98 | NH$_4$F | 1 | | | | 99 | 140 |
| Comparative Example 2 | Without use of protective fluid | | | NH$_4$F | 1 | | | | 99 | 144 |
| Comparative Example 3 | | | | HF | 0.05 | | | | 99.95 | 86 |
| Comparative Example 4 | | | | HF·KF | 1 | | | | 99 | 434 |
| Comparative Example 5 | | | | | | 1 | KOH | 0.1 | 98.9 | 26 |
| Comparative Example 6 | | | | | | 1 | NH$_3$ | 0.1 | 98.9 | 25 |
| Comparative Example 7 | | | | | | 1 | TMAH | 0.1 | 98.9 | 68 |

TMAH: tetramethylammonium hydroxide

Reference Examples 1-6

In Reference Examples 1-6, a wafer with an alumina film was immersed in a washing solution containing an alkaline earth metal compound shown in Table 2 at 50° C. for 5 minutes, and after that, rinsing with ultrapure water and drying by dry nitrogen gas jet were carried out. The difference between the film thicknesses of the wafer with the alumina film before and after the treatments was divided by the time for immersion in the washing solution to calculate E.R. When compared to Reference Examples 3-6, it is understood that in Reference Examples 1-2, alumina corrosion caused by the washing solution was successfully suppressed by adding a barium-containing inorganic substance to the washing solution.

REFERENCE SIGNS LIST

1: alumina
2: dry etching residue
3: alumina-based hard mask
4: hard mask (other than alumina-based hard mask)
5: resist
6: low-dielectric-constant interlayer dielectric film

The invention claimed is:
1. A method for protecting alumina, the method comprising:
   treating at least a portion of a surface of an alumina layer comprising alumina with a protective fluid consisting of (i) water and (ii) barium nitrate, barium acetate, and/or barium chloride in a range of from more than 1

TABLE 2

| | Washing solution | | | | | | | | |
| | Alkaline earth metal (A) | | Fluoride | | Hydrogen peroxide | Alkali | | Water | Al$_2$O$_3$ E.R. |
| | Type | % by mass | Type | % by mass | % by mass | Type | % by mass | % by mass | (Å/min) |
|---|---|---|---|---|---|---|---|---|---|
| Reference Example 1 | Ba nitrate | 0.05 | NH$_4$F | 1 | | | | | 4 |
| Reference Example 2 | Ba nitrate | 2 | | | 1 | KOH | 0.1 | | 6 |
| Reference Example 3 | Be sulfate | 2 | NH$_4$F | 1 | | | | | 142 |
| Reference Example 4 | Mg nitrate | 2 | NH$_4$F | 1 | | | | | 140 |
| Reference Example 5 | Sr nitrate | 2 | NH$_4$F | 1 | | | | | 140 |
| Reference Example 6 | Ca nitrate | 2 | NH$_4$F | 1 | | | | | 146 | to 20 wt. % together, based on total protective fluid weight, to thereby form a fluid film on the portion of the surface of the alumina layer; and washing over the fluid film and the alumina layer with an optionally corrosive washing solution, wherein the treating is at a temperature in a range of from 30 to 60° C. for a time in a range of from 0.2 to less than 60 minutes.

2. A method for producing a semiconductor substrate having an alumina layer, the method comprising:

protecting alumina comprised in the alumina layer using the method of claim 1.

3. A method for producing a semiconductor substrate having an alumina layer, the method comprising:

protecting alumina comprised in the alumina layer by treating the alumina layer with the protective fluid consisting of (i) water and (ii) barium nitrate, barium acetate, and/or barium chloride in a range of from more than 1 to 20 wt. % together, based on total protective fluid weight, to thereby form a fluid film on the portion of the surface of the alumina layer; and washing over the fluid film and the alumina layer with an optionally corrosive washing solution, wherein the treating is at a temperature in a range of from 30 to 60° C. for a time in a range of from 0.2 to less than 60 minutes.

4. The method of claim 1, wherein the alumina is in an alumina layer.

5. The method of claim 1, wherein the barium nitrate is present in the protective fluid.

6. The method of claim 2, wherein the barium nitrate is present in the protective fluid.

7. The method of claim 3, wherein the barium nitrate is present in the protective fluid.

8. The method of claim 1, wherein the barium acetate is present in the protective fluid.

9. The method of claim 2, wherein the barium acetate is present in the protective fluid.

10. The method of claim 3, wherein the barium acetate is present in the protective fluid.

11. The method of claim 1, wherein the barium chloride is present in the protective fluid.

12. The method of claim 2, wherein the barium chloride is present in the protective fluid.

13. The method of claim 3, wherein the barium chloride is present in the protective fluid.

14. The method of claim 1, wherein the barium nitrate, the barium acetate, and/or the barium chloride are present in the protective fluid is from 1.5 to 10% by mass.

15. The method of claim 2, wherein the barium nitrate, the barium acetate, and/or the barium chloride are present in the protective fluid is from 1.5 to 10% by mass.

16. The method of claim 3, wherein the barium nitrate, the barium acetate, and/or the barium chloride are present in the protective fluid is from 1.5 to 10% by mass.

17. The method of claim 1, wherein the barium nitrate, the barium acetate, and the barium chloride are present in the protective fluid.

18. The method of claim 1, wherein the barium nitrate, the barium acetate, and/or the barium chloride, together, are present in the protective fluid in a range of from 1 to 2% by mass.

19. The method of claim 1, wherein the treating is at a temperature in a range of from 30 to 55° C.

20. The method of claim 1, wherein the treating is at a temperature in a range of from 40 to 55° C.

* * * * *